(12) United States Patent
Gaggl

(10) Patent No.: US 6,686,798 B2
(45) Date of Patent: Feb. 3, 2004

(54) REFERENCE VOLTAGE CIRCUIT

(75) Inventor: Richard Gaggl, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/246,342

(22) Filed: Sep. 18, 2002

(65) Prior Publication Data

US 2003/0067346 A1 Apr. 10, 2003

(30) Foreign Application Priority Data

Oct. 1, 2001 (DE) .......................... 101 48 487

(51) Int. Cl.$^7$ ................................. G05F 1/10
(52) U.S. Cl. ..................................... 327/540
(58) Field of Search ............................ 327/530, 534, 327/535, 538, 540, 541, 543

(56) References Cited

U.S. PATENT DOCUMENTS

| | | | |
|---|---|---|---|
| 5,497,119 A | * 3/1996 | Tedrow et al. | ............... 327/540 |
| 5,589,831 A | 12/1996 | Knee | |
| 6,181,196 B1 | * 1/2001 | Nguyen | ............... 327/539 |

* cited by examiner

*Primary Examiner*—Jeffrey Zweizig
(74) *Attorney, Agent, or Firm*—Jenkins, Wilson & Taylor, P.A.

(57) ABSTRACT

Reference voltage circuit for generating at least one constant reference voltage ($V_{ref}$) with a first current mirror circuit (54), which is connected to a positive supply voltage ($V_{dd}$) and mirrors a reference current ($I_{ref}$) with a first current mirror factor ($N_1$) to form a first mirrored reference current ($I_{S1}$); a second current mirror circuit (67), which is connected to a negative supply voltage ($V_{ss}$) and mirrors a reference current ($I_{ref}$) with a second current mirror factor ($N_2$) to form a second mirrored reference current ($I_{S2}$); a resistor string (71), which comprises a plurality of resistors (71-$i$) connected in series and is wired between the two current mirror circuits (54, 67);

one end (42) of the resistor string (71) being supplied with the first mirrored reference current ($I_{S1}$) from the first current mirror circuit (54) and the other end (73) of the resistor string (71) delivering the second mirrored reference current ($I_{S2}$) to the second current mirror circuit (67), the two current mirror factors ($N_1$, $N_2$) of the current mirror circuits (54, 67) being equal, so that constant reference voltages can be picked off at the resistors (71-$i$) of the resistor string (71).

10 Claims, 2 Drawing Sheets

REFERENCE VOLTAGE CIRCUIT

TECHNICAL FIELD

The invention relates to a reference voltage circuit for generating at least one constant reference voltage independently of fluctuations of a reference potential.

BACKGROUND ART

Reference voltage circuits for generating reference voltages are required in many circuits. There are applications in which exact reference voltages $V_{ref}$ with respect to a common mode voltage (VCM), which varies within certain voltage limits, are required. FIG. 1 shows such an application. On an SLIC circuit (SLIC: Subscriber Line Interface Circuit), a terminal device is connected via a twisted two-wire telephone line. The SLIC circuit generates from the line currents measured via current sensors a transversal current $I_r$ for the voice signal and a longitudinal current $I_L$ for the necessary control information. The currents $I_{IL}$, $I_{IT}$ generated by the SLIC circuit are converted by means of resistors $R_{IL}$, $R_{IT}$ into corresponding voltages for further processing by a CODEC circuit. In this case, the two resistors $R_{IL}$, $R_{IT}$ are respectively wired between an input-terminal pad $I_T$, $I_L$ of the CODEC circuit and a common-mode reference voltage terminal VCM.

The CODEC circuit includes a reference voltage source for generating a reference voltage $V_{float}$. This reference voltage $V_{float}$ is applied to the common-mode voltage terminal VCM via a buffer B. The reference voltage generated by the reference voltage source may vary within certain voltage limits, typically by +/−100 mV.

In the case of the conventional CODEC circuit represented in FIG. 1, the generated reference voltage $V_{float}$ is applied to a noninverting amplifier V, which is set for boosting the resistors $R_1$, $R_2$.

To generate an exact reference voltage at the output node K of the amplifier V, after the production of the CODEC semiconductor chip the voltage is measured at the node K via a measuring terminal $PAD_{meas}$ and the resistor $R_2$ of the amplifier circuit V is programmed by means of a programming logic PL in such a way that the desired exact reference potential is present at the node K. For this purpose, the programming logic PL is programmed by an external testing device via a data interface D in dependence on the measured voltage $V_{meas}$. The programmable resistor $R_2$ is, for example, a multiplicity of programmable laser fuses.

After the setting or trimming of the amplifier circuit V, a constant reference voltage is present at the node K. This constant reference voltage is amplified by a voltage amplifier by a gain factor n and applied to one end of a resistor string, which comprises a multiplicity of resistors R. The constant reference voltage present at the node is also connected directly to a center tap of the resistor string. On the resistor string, voltages drop across the various resistors, so that reference voltages which relate to the negative supply voltage $V_{ss}$ are generated at the node of the resistor string. The resistor string shown in FIG. 1 has m resistors R connected in series for generating m+1 reference voltages. In this case, all the nodes or reference voltages of the resistor string relate to the negative supply voltage $V_{ss}$ of the CODEC circuit. In the case of the example represented in FIG. 1, the generated reference voltages are used as threshold voltages for the comparators of the CODEC circuit.

The circuit represented in FIG. 1 for generating the reference voltages for the comparators has several considerable disadvantages. The circuit for generating the reference voltage is relatively complex in terms of its circuitry, since, after producing the semiconductor chip, the amplifier V has to be set or trimmed by programming the resistor $R_2$ to generate an absolutely constant voltage $V_{constant}$. Therefore, the amplifier V requires a programming logic PL which is relatively complex in terms of its circuitry, to which moreover it must be possible for a testing device to be connected via a PSP data interface D. In addition, a measuring terminal $PAD_{meas}$ must be provided on the CODEC circuit in order to measure the floating reference voltage $V_{float}$ initially occurring at the node K for setting the amplifier. The measuring or testing of the CODEC chip produced for setting the amplifier circuit V requires a relatively long testing time, so that the production costs for producing the CODEC chip increase. Furthermore, in the semiconductor CODEC chip there must be provided a dedicated measuring pad exclusively for setting the amplifier V.

A further considerable disadvantage of the circuit represented in FIG. 1 for generating a reference voltage according to the prior art is that the comparators within the CODEC circuit may make incorrect decisions. The reference voltage $V_{float}$ generated by the reference voltage source is not constant during the service life, but fluctuates within certain limits. At the same time, the reference voltage $V_{float}$ generated by the reference voltage source depends on the temperature and is influenced by process variations within the production process. In addition, the reference voltage changes over time due to ageing processes on the semiconductor chip. The common mode voltage VCM given out over the buffer B varies in the same way as the reference voltage $V_{float}$, also with the addition of a buffer offset voltage, which likewise depends on the ambient temperature T. It is therefore necessary to provide the relatively complex amplifier circuit V with the integrated programming logic PL, which however is set in a one-off trimming operation after the production of the semiconductor chip and cannot compensate for subsequent fluctuations of the reference voltage $V_{float}$.

The voltage amplifier connected to the node K likewise has an offset voltage and additionally amplifies with a constant factor n fluctuations occurring. On account of the propagation of errors, the reference voltages $V_{refi}$ present at the comparators vary greatly in dependence on the temperature T and the time t.

The reference voltages picked off at the nodes of the resistor string also relate to the negative supply voltage $V_{ss}$, so that fluctuations or disturbances of the negative supply voltage $V_{ss}$ have a direct effect on the reference voltages $V_{refi}$. Fluctuations of the negative supply voltage $V_{ss}$ or ground bouncing consequently lead to direct fluctuations of the reference voltages $V_{refi}$ for the comparators of the CODEC circuit.

The signaling voltages present at the inputs $I_T$, $I_L$, which are picked off at the resistors $R_{IL}$, $P_{IT}$, relate to the common mode voltage VCM, so that the strong fluctuations of the reference voltage $V_{refi}$ that occur lead to incorrect decisions within the comparators.

SUMMARY OF THE INVENTION

It is therefore the object of the present invention to provide a reference voltage circuit for generating reference voltages which generates constant reference voltages independently of fluctuations of a reference voltage.

This object is achieved according to the invention by a reference voltage with the features specified in patent claim 1.

The invention provides a reference voltage circuit for generating at least one constant reference voltage with a first current mirror circuit, which is connected to a positive supply voltage ($V_{DD}$) and mirrors a reference current with a first current mirror factor (N1) to form a first mirrored reference current, a second current mirror circuit, which is connected to a negative supply voltage ($V_{ss}$) and mirrors the reference current with a second current mirror factor (N2) to form a second mirrored reference current, a resistor string, which comprises a plurality of resistors connected in series and is wired between the two current mirror circuits, one end of the resistor string being supplied with the first mirrored reference current from the first current mirror circuit and the other end of the resistor string delivering the second mirrored reference current to the second current mirror circuit, the two current mirror factors (N1, N2) of the current mirror circuits being equal, so that constant reference voltages can be picked off at the resistors of the resistor string.

The reference voltage circuit according to the invention has the advantage that it generates constant reference voltages, for example for comparators, independently of fluctuations of a reference potential, without provision of an additional trimming or setting circuit.

This has in turn the advantage that no dedicated measuring terminal pad and no programming logic PL with associated data interface D is necessary, and it is possible to dispense with trimming of the integrated circuit.

In the case of a preferred embodiment of the reference voltage circuit according to the invention, the first current mirror circuit additionally mirrors the reference current with a current mirror factor of 1 and delivers the mirrored reference current to the second current mirror circuit as a reference current.

The reference voltages picked off at the resistors of the resistor string are preferably picked off at high impedance.

In the case of a preferred embodiment of the reference voltage circuit according to the invention, there is an even number of resistors within the resistor string.

Preferably no current flows away at the center tap of the resistor string.

In the case of a preferred embodiment of the reference voltage circuit according to the invention, the reference current is generated by a voltage-controlled current source.

In this case, the voltage-controlled current source is preferably connected to a reference voltage source.

The reference voltage circuit according to the invention is preferably integrated in a semiconductor chip.

In this case, the center tap of the resistor string is preferably in connection with a reference voltage pad of the semiconductor chip.

The reference voltages generated by the reference voltage circuit according to the invention preferably lie symmetrically between the positive supply voltage ($V_{dd}$) and the negative supply voltage ($V_{ss}$) of the semiconductor chip.

A preferred embodiment of the reference voltage circuit according to the invention is described below with reference to the accompanying figures to explain features pertinent to the invention.

DETAILED DESCRIPTION OF THE INVENTION

Figure 1:
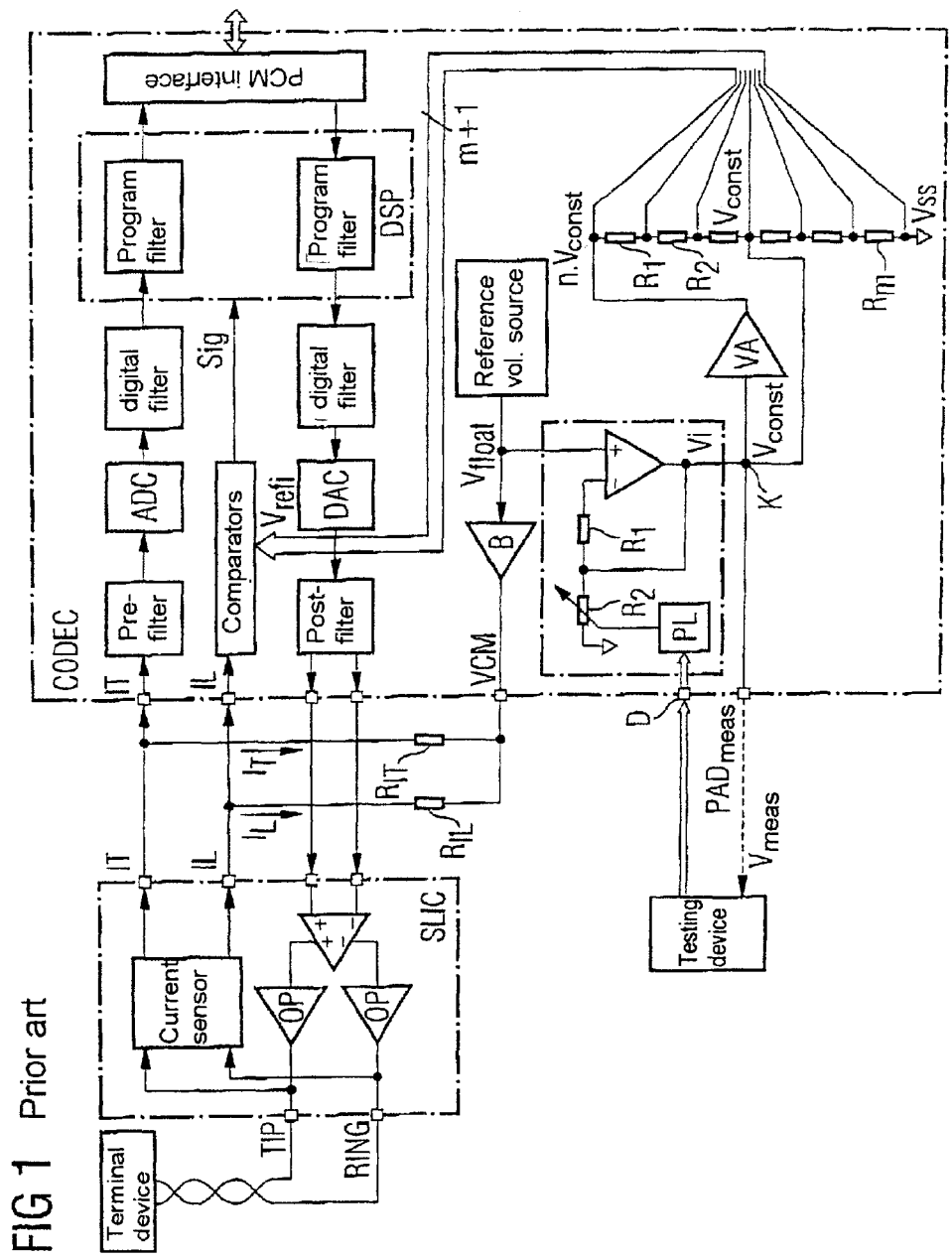
FIG. 1 shows a CODEC circuit with an integrated reference voltage circuit according to the prior art.
Figure 2:
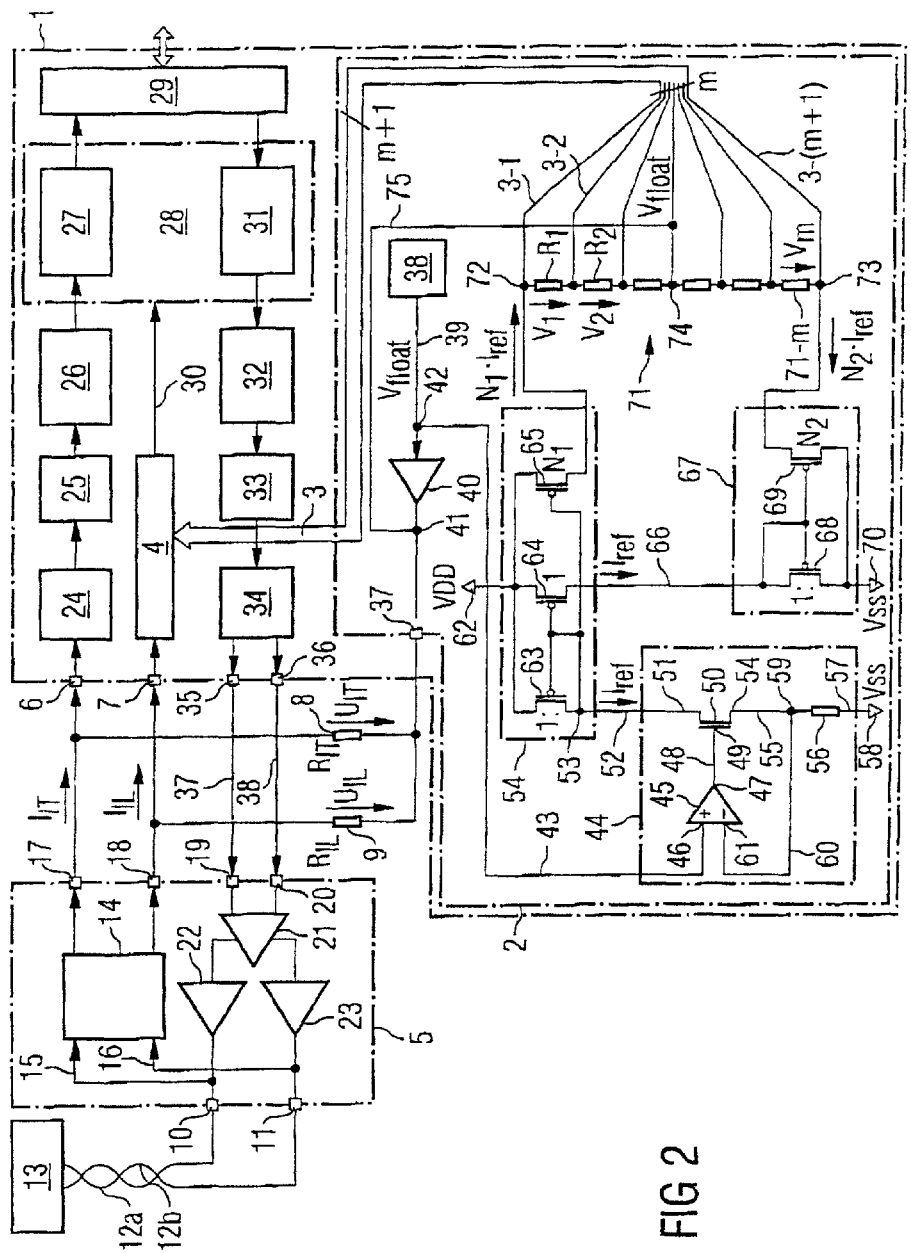
FIG. 2 shows a CODEC circuit with a reference voltage circuit according to the invention integrated in it.

FIG. 2 shows a CODEC circuit 1 with a reference circuit 2 integrated in it for generating a plurality of constant reference voltages, which are given out via reference voltage lines 3 to comparator circuits 4 within the CODEC circuit 1.

The CODEC circuit 1 is connected to an SLIC circuit 5 and receives via the input terminals 6, 7 an input voltage $U_{TT}$, which is picked off at the external resistor 8, and an input voltage $U_{IL}$, which is picked off at the external resistor 9. At the external resistor 8 there is a transversal current $I_{TT}$, which in the case of the example shown reproduces a voice signal. At the resistor 9 there is a voltage $U_{IL}$ which is proportional to the lateral current $I_{IL}$ and essentially contains control information for the signal processing. The SLIC circuit 5 is connected via terminals 10, 11 and via a twisted 2-wire telephone line 12a, 12b to a terminal device 13. The SLIC circuit 5 essentially includes a current sensor circuit 14, which measures via internal lines 15, 16 the line currents flowing through the lines 12a, 12b and delivers them as a transversal current $I_{TT}$ or lateral current $I_{IL}$ via the terminals 17, 18 to the CODEC circuit 1. The SLIC circuit 5 also has input terminals 19, 20, which are connected to a differentially constructed operational amplifier 21. The signals emitted by the operational amplifier 21 are also amplified in the amplifiers 22, 23 and delivered to the terminal device 13.

The CODEC circuit 1 includes in the voice signal path an analog pre-filter 24, a downstream analog-digital converter 25, a digital filter 26 and a programmable filter 27 within a DSP signal processor 28. The programmable filter 27 is connected on the output side to a PCM interface 29.

In the control signal path, the CODEC circuit is provided with comparators, which compare the control signal voltage $U_{IL}$ present at the input terminal 7 with the generated reference voltages $V_{ref}$ and emit control signals via control lines 30 to the DSP processor 28.

In the oppositely directed voice signal path, the CODEC circuit includes within the DSP processor 28 a programmable filter 31, a downstream digital filter 32, a digital-analog converter 33 and an analog post-filter 24, which is connected on the output side to output terminals 35, 36 of the CODEC circuit 1. The output terminals 35, 36 of the CODEC circuit 1 are connected via lines 37, 38 to the input terminals 19, 20 of the SLIC circuit 5.

The external resistors 8, 9 for generating the input voltages $U_{IL}$, $U_{TT}$, are connected to a reference-voltage terminal pad 37 of the CODEC circuit 1. The CODEC circuit 1 includes a reference voltage source 38, which generates a reference voltage $V_{float}$. The generated reference voltage is variable within predetermined limits and varies for example by +/−100 mV. The reference voltage given out by the reference voltage source 38 is delivered via a line 39 to a buffer 40, which buffers the reference voltage, the buffered reference voltage being applied via a line 41 to the reference voltage terminal 37 of the CODEC circuit 1. The generated reference voltage is picked off via a branching node 42 and delivered via a line 43 to a voltage-controlled current source 44 within the reference voltage circuit 2. The voltage-controlled current source 44 includes an operational amplifier 45, the noninverting input 46 of which is connected to the line 43. The output terminal 47 of the operational amplifier 45 is connected via a line 48 to a gate terminal 49 of an NMOS field-effect transistor 50. The source terminal 51 of the NMOS field-effect transistor is connected via a line 52 to an input 53 of a first current mirror circuit 54. The drain terminal 58 of the NMOS field-effect transistor is connected via a line 55 to a resistor 56, which is connected via a line 57 to a supply voltage terminal 58 for applying a negative supply voltage $V_{ss}$. In the line 55, the drain terminal 54 of the NMOS field-effect transistor 50 is led back at a branching node 59 via a line 60 to the inverting input 61 of the operational amplifier 45.

The first current mirror circuit 54 is connected to a supply voltage terminal 62 for a positive supply voltage $V_{dd}$. The first current mirror circuit 54 contains three PMOS field-effect transistors 63, 64, 65. In this case, the gate terminals of the PMOS field-effect transistors 64, 65 are connected to the gate terminal of the PMOS field-effect transistor 63.

The voltage-controlled reference current source 44 generates in dependence on the reference voltage $V_{float}$ present at the node 42 a reference current $I_{ref}$, which is mirrored by the current mirror circuit 54. In this case, the PMOS transistor 64 mirrors the reference current $I_{ref}$ flowing through the PMOS transistor 63 in a current mirror ratio of preferably one and delivers the mirrored reference current $I_{ref}$ via a line 66 to a further current mirror circuit 67. The second current mirror circuit 67 contains two NMOS field-effect transistors 68, 69, the gate terminals of which are connected to each other and are connected to the line 66.

The first current mirror circuit 54 is connected to the positive supply voltage $V_{dd}$ and mirrors the reference current $I_{ref}$ flowing through the line 52 with a first current mirror factor $N_1$ to form a first mirrored reference current $I_{S1}$:
$I_{S1}=N_1 \cdot I_{ref}$.

The second current mirror circuit 67 is connected to a supply voltage terminal 70 for a negative supply voltage $V_{ss}$. The current mirror circuit 67 mirrors the reference current $I_{ref}$ flowing through the line 66 with a second current mirror factor $N_2$ to form a second mirrored reference current $I_{S2}$:
$I_{S2}=N_2 \cdot I_{ref}$.

Connected between the two current mirror circuits 54, 67 is a resistor string 71, which comprises a multiplicity of resistors 71-1, 71-2, 71-3 ... 71-$m$. The resistor string 71 has a first end 72, which is connected to the NMOS field-effect transistor 54, and a second end 73, which is connected to the NMOS field-effect transistor 69 of the second current mirror circuit 67.

In the case of the reference voltage circuit 2 according to the invention, the current mirror factors $N_1$, $N_2$ of the two current mirror circuits 54, 67 are identical, so that the current $I_{S1}=N_1 \times I_{ref}$ flowing into the resistor string is identical to the current $I_{S2}=N_2 \times I_{ref}$ flowing out of the resistor string. The resistor string 71 preferably has an even number of resistors 71-$i$, a center tap 74 in the center of the resistor string 71 preferably being connected via a coupling line 75 to the reference voltage terminal 37 of the semiconductor chip 1. Since the current $I_{S1}$ flowing into the resistor string 71 at the first end 72 is identical to the current $I_{S2}$ flowing out at the end 73, no current flows away at the center tap 74, so that no current flows via the line 75 to the reference voltage terminal 37. At the series-connected resistors 71-$i$ of the resistor string 71, the reference voltage lines 3-$i$ are tapped at high impedance. With m resistors 71-$c$ connected in series, altogether a maximum of m+1 reference voltage lines 3-$c$ are tapped. The reference voltages in this case preferably lie symmetrically between the positive supply voltage $V_{dd}$ and the negative supply voltage $V_{ss}$. An essentially constant reference current $I_{ref}$ is generated by the voltage-controlled current source in dependence on the reference voltage $V_{float}$. This reference current $I_{ref}$ is multiplied by the two current mirror circuits 54, 67 and fed into the first end 72 of the resistor string 71 and drawn out from the end 73 of the resistor string 71. The current $I=N_1 \times I_{ref}=N_2 \times I_{ref}$ flowing through the resistor string generates in the resistor string comprising the resistors 71-$i$ voltage drops $V_1$, $V_2$, which serve in the case of a high-impedance voltage tap as reference voltages, for example for comparator circuits 4. With ideal matching of all the mirrored currents, no current flows at the center tap 74.

In the case of the reference voltage circuit according to the invention, it is essential that a voltage variation of the reference voltage $V_{float}$ present at the node 42 is transferred to all the nodes within the resistor string 71, so that the voltage drops across the resistors 71-$i$, and consequently the reference voltages $V_{ref}$, remain constant. The reference voltages $V_{ref}$ at the various nodes of the resistor string 71 are shifted along with the change in reference potential $V_{float}$ in a corresponding way. In the case of the reference voltage circuit 2 according to the invention, it is therefore not necessary to carry out trimming or setting of the reference potential. Since no trimming or setting is necessary, the necessary testing time for testing the semiconductor chip 1 can be reduced, and consequently the costs of production can be lowered. In addition, the reference voltage according to the invention is distinguished by very low complexity in terms of circuitry and the associated lower requirements for surface area and power loss. In particular, the reference voltage circuit according to the invention requires no complex programming logic and interface for trimming the reference potential.

With ideal matching between the resistor R and the resistor string, process variations in production of the resistors are compensated.

What is claimed is:

1. A reference voltage circuit for generating at least one constant reference voltage with:

(a) a first current mirror circuit, which is connected to a positive supply voltage and mirrors a reference current with a first current mirror factor to form a first mirrored reference current, (b) a second current mirror circuit, which is connected to a negative supply voltage and mirrors a reference current with a second current mirror factor to form a second mirrored reference current, (c) a resistor string, which comprises a plurality of resistors connected in series and is wired between the two current mirror circuits;

one end of the resistor string being supplied with the first mirrored reference current from the first current mirror circuit and the other end of the resistor string delivering the second mirrored reference current to the second current mirror circuit, (d) the two current mirror factors of the current mirror circuits being equal, so that constant reference voltages can be picked off at the resistors of the resistor string.

2. The reference voltage circuit as claimed in claim 1, wherein the first current mirror circuit additionally mirrors the reference current with a current mirror factor of one and delivers it via a line to the second current mirror circuit.

3. The reference voltage circuit as claimed in claim 1, wherein the reference voltages are picked off at high impedance at the resistor string.

4. The reference voltage circuit as claimed in claim 1, wherein there is an even number of resistors within the resistor string.

5. The reference voltage circuit as claimed in claim 1, wherein no current flows away at the center tap of the resistor string.

6. The reference voltage circuit as claimed in claim 1, wherein the reference current is generated by a voltage-controlled current source.

7. The reference voltage circuit as claimed in claim 6, wherein the voltage-controlled current source is connected to a reference voltage source.

8. The reference voltage circuit as claimed in claim 1, wherein the reference voltage circuit is integrated in a semiconductor chip.

9. The reference voltage circuit as claimed in claim 1, wherein the center tap of the resistor string is connected to a reference-voltage terminal pad of the semiconductor chip.

10. The reference voltage circuit as claimed in claim 1, wherein the generated reference voltages lie symmetrically between the positive supply voltage and the negative supply voltage.

* * * * *